(12) United States Patent
Gupta et al.

(10) Patent No.: US 12,069,794 B2
(45) Date of Patent: Aug. 20, 2024

(54) DYNAMIC CONTROL OF HEAT SINK PRESSURE

(71) Applicant: Cisco Technology, Inc., San Jose, CA (US)

(72) Inventors: Rohit Dev Gupta, Brookefield Bangalore (IN); Arjun Jayaprakash Guzar, Puttenahalli Bengaluru (IN); Tilak Gaitonde, Jakkur Bangalore (IN)

(73) Assignee: CISCO TECHNOLOGY, INC., San Jose, CA (US)

( * ) Notice: Subject to any disclaimer, the term of this patent is extended or adjusted under 35 U.S.C. 154(b) by 224 days.

(21) Appl. No.: 17/858,819

(22) Filed: Jul. 6, 2022

(65) Prior Publication Data

US 2024/0015880 A1  Jan. 11, 2024

(51) Int. Cl.
*H05K 1/02* (2006.01)

(52) U.S. Cl.
CPC ..... *H05K 1/0203* (2013.01); *H05K 2201/066* (2013.01); *H05K 2201/10734* (2013.01)

(58) Field of Classification Search
CPC .......... H05K 1/0203; H05K 2201/066; H05K 2201/10734
See application file for complete search history.

(56) References Cited

U.S. PATENT DOCUMENTS

| | | | |
|---|---|---|---|
| 7,064,957 B1 | 6/2006 | Liang et al. | |
| 7,139,174 B1* | 11/2006 | Nguyen | H01L 23/4006 361/709 |
| 7,712,980 B2 | 5/2010 | Tokita et al. | |
| 8,217,558 B2 | 7/2012 | Bancken et al. | |
| 8,535,787 B1 | 9/2013 | Lima | |
| 8,876,412 B2 | 11/2014 | Aoki et al. | |
| 9,992,911 B1 | 6/2018 | Buckman et al. | |
| 10,310,565 B2 | 6/2019 | Aoki et al. | |
| 10,401,581 B2 | 9/2019 | Gaal | |
| 10,575,448 B1* | 2/2020 | Lewis | H05K 9/0081 |
| 2006/0171129 A1* | 8/2006 | Berto | H01L 23/4006 257/E23.084 |
| 2013/0081389 A1 | 4/2013 | Browne et al. | |

(Continued)

FOREIGN PATENT DOCUMENTS

| | | |
|---|---|---|
| DE | 202020102450 U1 | 8/2020 |
| EP | 3543753 A1 | 9/2019 |

OTHER PUBLICATIONS

DE-202020102450-U1 EPO Translation, published Aug. 13, 2020.

(Continued)

*Primary Examiner* — Sherman Ng
(74) *Attorney, Agent, or Firm* — Edell, Shapiro & Finnan, LLC

(57) ABSTRACT

Techniques are provided herein for dynamic pressure control of a heat sink. In one example embodiment, an apparatus includes a Ball Grid Array (BGA) device, a heat sink thermally coupled to the BGA device, and a pressure control assembly configured to dynamically control a pressure of the heat sink on the BGA device based on a temperature associated with the BGA device. The pressure control assembly includes a Shape Memory Alloy (SMA) washer configured to apply a first amount of the pressure when the SMA washer is in a first state, and a second amount of the pressure when the SMA washer is in a second state.

20 Claims, 9 Drawing Sheets

(56) References Cited

U.S. PATENT DOCUMENTS

| | | | |
|---|---|---|---|
| 2016/0351526 A1 | 12/2016 | Boyd et al. |
| 2019/0056835 A1 | 2/2019 | Xia |
| 2019/0176722 A1 | 6/2019 | Saele |
| 2019/0246488 A1 | 8/2019 | Kuklinski et al. |
| 2020/0100386 A1 | 3/2020 | Saturley et al. |
| 2020/0163249 A1 | 5/2020 | So et al. |
| 2020/0229318 A1 | 7/2020 | Grau et al. |
| 2020/0260615 A1 | 8/2020 | Leigh et al. |
| 2020/0331639 A1 | 10/2020 | Mindock et al. |
| 2022/0053669 A1 | 2/2022 | Gupta et al. |

OTHER PUBLICATIONS

Wikipedia, Thermal interface material, https://en.wikipedia.org/w/index phptitle=Thermal_interface_material&oldid=1059368678, retrieved Jun. 8, 2022, 2 pages.

Wikipedia, "Ball grid array," https://en.wikipedia.org/w/index.php?title=Ball_grid_array&oldid=1076490163, retrieved Jun. 8, 2022, 7 pages.

Wikipedia, "Printed circuit board," https://en.wikipedia.org/w/index.php?title=Printed_circuit_board&oldid=1091794482, retrieved Jun. 8, 2022, 26 pages.

Wikipedia, "Die (integrated circuit)," https://en.wikipedia.org/w/index.php?title=Die_(integrated_circuit)&oldid=1076034519, retrieved Jun. 8, 2022, 3 pages.

Wikipedia, "Shape-memory alloy," https://en.wikipedia.org/w/index.php?title=Shape-memory_alloy&oldid=1091579794, retrieved Jun. 7, 2022, 17 pages.

Intrinsic Devices Incorporated, "Active Fasteners," http://www.intrinsicdevices.com/active_fasteners.html, retrieved May 31, 2022, 7 pages.

Chang et al., "Self-Monitoring and Self-Healing Bolted Joints Using Shape Memory Alloy," http://www.iaarc.org/publications/proceedings_of_the_28th_isarc/, selfmonitoring_and_selfhealing_bolted_joints_using_shape_memory_alloy.html, retrieved May 31, 2022, 2 pages (824-825).

Lee Spring Company, "Search for Springs," https://www.leespring.in/compression-springs, retrieved May 31, 2022, 11 pages.

Lee Spring Company, "Part No. LCM125DA 01 M," https://www.leespring.com/compression-springs?search=LCM125DA01M, retrieved May 31, 2022, 1 page.

India Mart, "Round Stainless Steel Ring TypeHeater," https://www.indiamart.com/proddetail/ring-type-heater-12667490288.html?pos=2&pla=n, retrieved May 31, 2022, 6 pages.

Alibaba, "MCH ceramic disc as small round ceramic heating element," https://www.alibaba.com/product-detail/MCH-ceramic-disc-as-small-round_62341949355.html, retrieved May 31, 2022, 8 pages.

Graziano et al., "Effect of TIM Compression Loads On BGA Reliability," Proceedings of SMTA International, retrieved May 30, 2022, 11 pages.

Research Gate, "Transparent and Conducting Polymer Nanocomposites—Thermally Conductive Polymer Nanocomposites for semiconductor heat dissipation," https://www.researchgate.net/publication/318684590, retrieved May 27, 2022, 8 pages.

XCYC Power Equipment Sales Co., Ltd., "Shape Memory Alloy Washer on Strain Clamp Heat Treatment Problem Solving," https://m.made-in-china.com/product/Shape-Memory-Alloy-Washer-on-Strain-Clamp-Heat-Treatment-Problem-Solving-1901617522.html, retrieved May 27, 2022, 12 pages.

\* cited by examiner

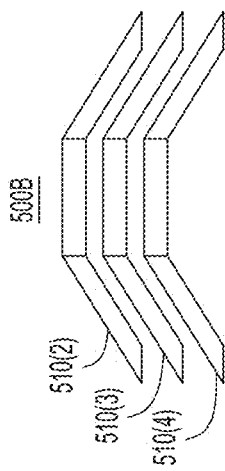
FIG.5A
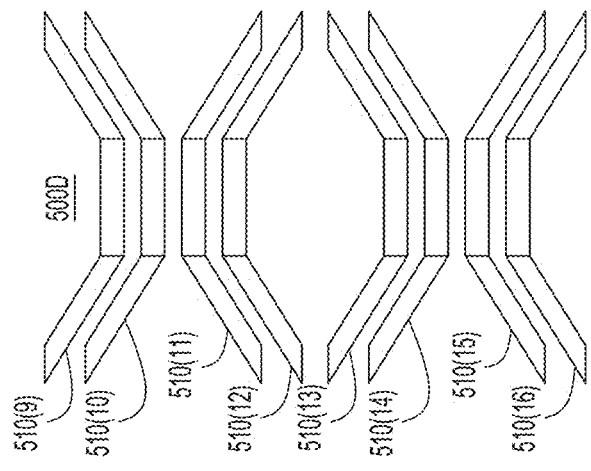
FIG.5B
FIG.5D
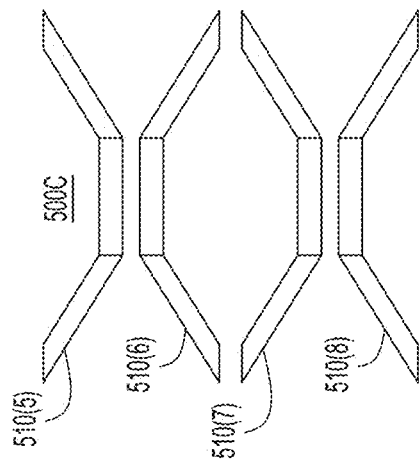
FIG.5C

700

710 — BASED ON A FIRST TEMPERATURE RANGE ASSOCIATED WITH A BALL GRID ARRAY DEVICE, APPLYING, VIA A SHAPE MEMORY ALLOY WASHER IN A FIRST STATE, A FIRST AMOUNT OF A PRESSURE OF A HEAT SINK ON THE BALL GRID ARRAY DEVICE

720 — BASED ON A SECOND TEMPERATURE RANGE ASSOCIATED WITH THE BALL GRID ARRAY DEVICE, APPLYING, VIA THE SHAPE MEMORY ALLOY WASHER IN A SECOND STATE, A SECOND AMOUNT OF THE PRESSURE OF THE HEAT SINK ON THE BALL GRID ARRAY DEVICE

FIG.7

DYNAMIC CONTROL OF HEAT SINK PRESSURE

TECHNICAL FIELD

The present disclosure relates to printed circuit boards (PCB) and electronic devices mounted on PCBs.

BACKGROUND

Shape Memory Alloy (SMA) is an alloy that changes its physical shape based on temperature. When SMA undergoes a change in temperature, it expands or contracts, forming a different shape. The specific temperatures and shapes associated with an SMA depend on the characteristics of that particular SMA.

BRIEF DESCRIPTION OF THE DRAWINGS

FIG. 5A illustrates a configuration involving a single SMA washer, according to an example embodiment.

FIG. 5B illustrates a configuration involving SMA washers arranged in parallel, according to an example embodiment.

FIG. 5C illustrates a configuration involving SMA washers arranged in series, according to an example embodiment.

FIG. 5D illustrates a configuration involving SMA washers arranged in parallel and in series, according to an example embodiment.

FIG. 7 illustrates a flowchart of a method for performing functions associated with operations discussed herein, according to an example embodiment.

DESCRIPTION OF EXAMPLE EMBODIMENTS

Overview

Techniques are provided herein for dynamic pressure control of a heat sink. In one example embodiment, an apparatus includes a Ball Grid Array (BGA) device, a heat sink thermally coupled to the BGA device, and a pressure control assembly configured to dynamically control a pressure of the heat sink on the BGA device based on a temperature associated with the BGA device. The pressure control assembly includes a shape memory alloy (SMA) washer configured to apply a first amount of the pressure when the SMA washer is in a first state, and a second amount of the pressure when the SMA washer is in a second state.

EXAMPLE EMBODIMENTS

Figure 1:
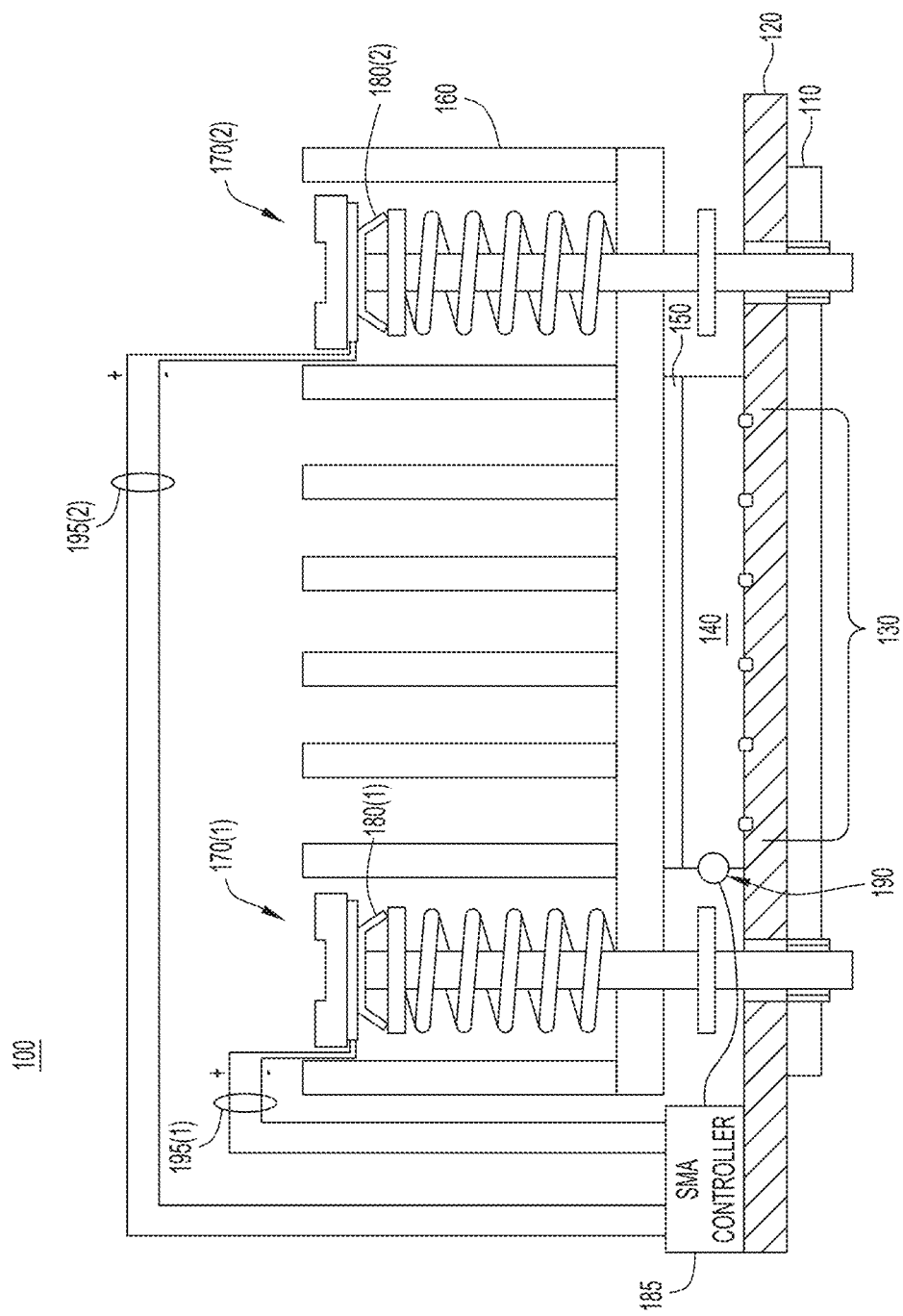
FIG. 1 illustrates a system for dynamically controlling heat sink pressure on a Ball Grid Array (BGA) device, according to an example embodiment.

FIG. 1 illustrates a system 100 for dynamically controlling heat sink pressure on a Ball Grid Array (BGA) device, according to an example embodiment. System 100 includes plate 110, printed circuit board (PCB) 120, BGA 130, die 140, thermal interface material (TIM) 150, and heat sink 160. Plate 110 may be a metallic backing plate configured to secure heat sink 160 and reduce strain rate by prevent components of system 100 from flexing. PCB 120 electrically connects one or more electronic components (e.g., resistors, capacitors, Integrated Circuit (IC) chips, transistors, diodes, etc.). BGA 130 may include a grid array of balls (e.g., solder balls) that electrically connect PCB 120 and die 140. Die 140 may be a semiconducting material or package (e.g., an IC). BGA 130 and die 140 may together be referred to as a "BGA device" that is mounted on PCB 120. TIM 150 may be any suitable material configured to enhance thermal coupling between die 140 and heat sink 160. Heat sink 160 may be thermally coupled to the BGA device, allowing the BGA device to maintain operating temperatures below a target threshold.

The greater the contact pressure between heat sink 160 and die 140, the less the thermal resistance between them. Thus, if the contact pressure is high, heat sink 160 will more readily draw heat from die 140. As a result, conventional systems would maximize the contact pressure between heat sink 160 and die 140, e.g., using springs to press heat sink 160 into die 140. Typically, these springs would be selected for maximum contact pressure to reduce thermal contact resistance between heat sink 160 and die 140. The spring forces would be set to a maximum value based on the permissible load capacity of BGA 130, which is under the pressure of heat sink 160 on die 140. However, this conventional approach can create cracks in balls of BGA 130 (e.g., during transportation and handling), which can lead to permanent failure over time or even immediately.

Accordingly, to prevent BGA failures due to the excessive contact pressure generated by conventional heat sink pressure systems, pressure control assemblies 170(1) and 170(2) are provided to dynamically control the pressure of heat sink 160 on the BGA device mounted on PCB 120 based on a temperature associated with the BGA device. Pressure control assemblies 170(1) and 170(2) include respective SMA washers 180(1) and 180(2) configured to apply a first amount of the pressure (e.g., lower pressure) when SMA washers 180(1) and 180(2) are in a first state (e.g., a neutral state), and a second amount of the pressure (e.g., higher pressure) when SMA washers 180(1) and 180(2) are in a second state (e.g., an activated state).

Thus, pressure control assemblies 170(1) and 170(2) may provide optimized BGA reliability and thermal performance by controlling the contact pressure at any given time. For example, pressure control assemblies 170(1) and 170(2) may maintain a lower contact pressure during shipment/transportation/handling; then, once the equipment is operational, pressure control assemblies 170(1) and 170(2) may increase the contact pressure to improve thermal performance. As a result, the SMA properties of SMA washer 180(1) and 180(2) may improve BGA reliability by preventing the failure of BGA balls during transportation and handling.

While two pressure control assemblies (pressure control assemblies 170(1) and 170(2)) are shown in FIG. 1, it will be appreciated that the techniques herein may employ any suitable number of pressure control assemblies. The actual number of pressure control assemblies may depend on factors such as the size/dimensions of heat sink 160 and die 140.

System 100 further includes SMA controller 185 and temperature sensor 190. SMA controller 185 may be a PCB-mounted device such as a Field-Programmable Gate Array (FPGA). Temperature sensor 190 may be embedded in die 140. SMA controller 185 is coupled to temperature sensor 190, and is also connected to pressure control assemblies 170(1) and 170(2) via wires 195(1) and 195(2), respectively. Temperature sensor 190 is thermally coupled to die 140 and is configured to obtain an indication of the temperature associated with the BGA device. For example, temperature sensor 190 may determine the temperature of die 140 and provide the indication of the temperature of die 140, in real-time, to SMA controller 185.

SMA controller 185 may obtain, from temperature sensor 190, the indication of the temperature associated with the BGA device. This indication may be referred to as "adaptive feedback." Software on SMA controller may read the indication obtained from temperature sensor 190 to determine the temperature of die 140. The temperature associated with the BGA device may indicate when system 100 is operational. For example, when system 100 is non-operational (e.g., under transport), the temperature may a low or ambient temperature; when system 100 is operational, the temperature may rise.

Based on the indication of the temperature associated with PCB 120, SMA controller 185 may regulate a power feed to pressure control assemblies 170(1) and 170(2) (e.g., to SMA washers 180(1) and 180(2)), over wires 195(1) and 195(2). SMA controller may dynamically control, via the power feed, the pressure (e.g., contact pressure) of heat sink 160 on the BGA device, and thereby maintain the temperature of die 140 within acceptable limits.

In one example, using the power feed, SMA controller 185 may cause SMA washers 180(1) and 180(2) to transition between a first state (e.g., a neutral state) and a second state (e.g., an activated state). Based on a first (e.g., low) temperature range associated with the BGA device, SMA controller 185 may apply, via SMA washers 180(1) and 180(2) in the first (e.g., neutral) state, a first (e.g., lower) amount of the pressure of heat sink 160 on the BGA device. Based on a second (e.g., high) temperature range associated with the BGA device SMA controller 185 may apply, via SMA washers 180(1) and 180(2) in the second (e.g., activated) state, a second (e.g., high or greater) amount of the pressure of heat sink 160 on the BGA device.

Although less heat is transferred from the BGA device to heat sink 160 when the temperature associated with the BGA device falls within the first (e.g., low) temperature range, the lower contact pressure may nevertheless be sufficient to keep the BGA device within acceptable temperature limits while prevent damage to the BGA device. When the temperature associated with the BGA device falls within the second (e.g., high) temperature range, SMA controller 185 may increase the pressure of heat sink 160 on the BGA device to improve thermal transfer efficiency and continue to keep the BGA device within acceptable temperature limits. Thus, SMA controller 185 may regulate the power feed to control the physical shape of SMA washers 180(1) and 180(2), ultimately controlling the contact pressure between heat sink 160 and the BGA device.

In some examples, SMA controller 185 may activate the power feed in response to the temperature associated with the BGA device exceeding a pre-defined value. When the temperature is below the pre-defined value, heat sink 160 may draw sufficient heat from the BGA device without the additional contact pressure generated by activating SMA washers 180(1) and 180(2). The adaptive feedback control may keep the temperature of the BGA device within target limits, and the power feed may be characterized for different ambient temperatures and airflow rates near system 100.

Thus, SMA controller 185 may control the power feed to SMA washers 180(1) and 180(2) based on the adaptive feedback from temperature sensor 190 to maintain the temperature of the BGA device within maximum operating limits. The adaptive feedback may enable SMA controller 185 to monitor the temperature associated with the BGA device (e.g., the temperature of the BGA device) and optimize the power feed accordingly to generate the desired contact pressure.

SMA controller 185 may regulate power feed based on any suitable adaptive feedback. In one example, the adaptive feedback may include the indication of the temperature of die 140. In other examples, SMA controller 185 may include an adaptive feedback based intelligence (e.g., software) to measure any suitable system operating parameter, such as ambient temperature, airflow, and temperatures of SMA washers 180(1) and 180(2). For instance, one or more additional temperature sensors may be included to read the real-time temperatures of SMA washers 180(1) and 180(2) and provide an indication of the temperatures to SMA controller 185. The one or more additional temperature sensors may be wire-based sensors such as thermocouples or thermistors. SMA controller 185 may regulate the power feed based on any suitable adaptive feedback to ensure an optimum contact pressure between heat sink 160 and the BGA device, thereby keeping the temperature of the BGA device below a target threshold.

Figure 2A:
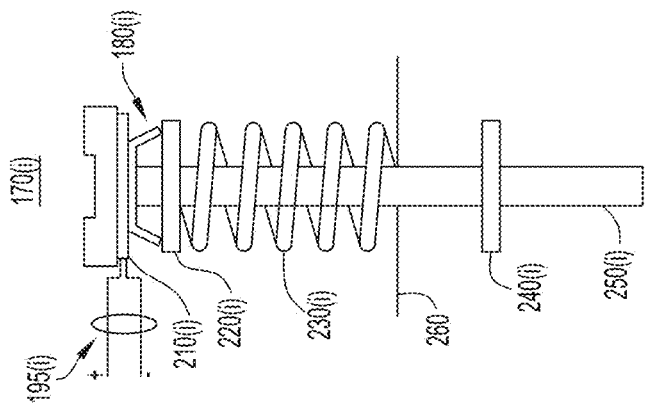
FIGS. 2A and 2B illustrate a pressure control assembly in a neutral state and an activated state, respectively, according to an example embodiment.
Figure 2B:
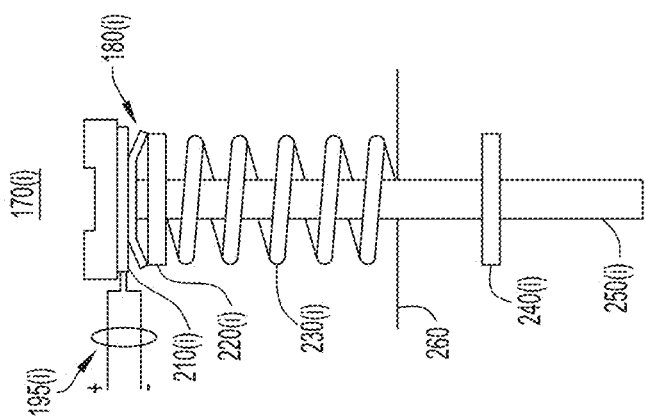

With continuing reference to FIG. 1, FIGS. 2A and 2B illustrate a pressure control assembly 170(i) in a neutral state and an activated state, respectively, according to an example embodiment. Pressure control assembly 170(i) includes wires 195(i), heater 210(i), SMA washer 180(i), washer 220(i), spring 230(i), clip 240(i), and screw 250(i). Screw 250(i) secures heater 210(i), SMA washer 180(i), washer 220(i), spring 230(i), and clip 240(i) about its body. Heater 210(i) is disposed adjacent to the head of screw 250(i), and SMA washer 180(i) is sandwiched between heater 210(i) and washer 220(i). One end of spring 230(i) abuts washer 220(i), and the other end abuts a surface 260 of heat sink 160.

Heater 210(i) may be a ceramic ring heater with sufficient load bearing capacity to accommodate spring pressure with any suitable SMA profile. Heater 210(i) may be thermally coupled to SMA washer 180(i). Heater 210(i) may be sufficiently thermally insulated such that it heats SMA washer 180(i) while other elements of pressure control assembly 170(i) remain thermally insulated. SMA washer 180(i) may be a Nitinol Belleville washer with a conical profile. Washer 220(i) may be a standard (e.g., non-SMA) washer, and spring 230(i) may be steel. Clip 240(i) may be a circular clip configured to secure spring 230(i) on screw 250(i). Clip 240(i) may also act as a stopping surface for heat sink 160 when pressure is exerted on heat sink 160.

SMA washer 180(i) is shown in a neutral state in FIG. 2A and in an activated state in FIG. 2B. When SMA washer 180(i) is in the neutral state (e.g., during shipping/handling), the contact pressure of heat sink 160 is relatively low and results from the nominal spring force and SMA washer 180(i) in neutral condition. When SMA washer 180(i) is in the activated state (e.g., during operation), the contact pressure of heat sink 160 is relatively high due to the increased spring force from the additional compression achieved by the activated state of SMA washer 180(i). Thus, system 100 may be shipped under spring load (e.g., neutral state), and may operate under an additional load (e.g., activated state).

In FIG. 2A (neutral state), the profile of SMA washer 180(i) exhibits less deflection (e.g., is flatter) than the profile of SMA washer 180(i) in FIG. 2B (activated state). Thus, in the neutral state, SMA washer 180(i) applies less force on washer 220(i), which in turn applies less force on spring 230(i), and which in turn applies less force on surface 260 of heat sink 160. SMA washer 180(i) may be in the neutral state when there is no power feed supplied to heater 210(i) via wires 195(i).

By contrast, in FIG. 2B (activated state), the profile of SMA washer 180(i) exhibits greater deflection than the profile of SMA washer 180(i) in FIG. 2A (neutral state). Thus, in the activated state, SMA washer 180(i) applies more force on washer 220(i), which in turn applies more force on spring 230(i), and which in turn applies more force on surface 260 of heat sink 160. SMA washer 180(i) may be in the activated state when there is a power feed (e.g., 12V feed) supplied to heater 210(i) via wires 195(i).

When system 100 is operational, the power feed activates SMA washer 180(i) by first activating (e.g., increasing the temperature of) heater 210(i). Because heater 210(i) is thermally coupled to SMA washer 180(i), heater 210(i) may increase the temperature—and the deflection—of SMA washer 180(i), causing SMA washer 180(i) to expand and transition from the neutral state (FIG. 2A) to the activated state (FIG. 2B). In the activated state, SMA washer 180(i) increases the compression length of spring 230(i), increasing the contact pressure of heat sink 160. Thus, the additional increase in contact pressure may be achieved by the SMA deflection. When the power feed is disabled, spring 230(i), which biases SMA washer 180(i) to the neutral state, may apply a restoring force to SMA washer 180(i) to cause SMA washer 180(i) to transition back from the activated state to the neutral state, thereby lowering the contact pressure.

SMA controller 185 may monitor the temperature associated with the BGA device (e.g., temperature of the BGA device), and, if the temperature exceeds a threshold, activate the power feed to SMA washer 180(i), causing SMA washer 180(i) to transition to the activated state (e.g., deform) and thereby increase the contact pressure. SMA controller 185 may manage the incremental increase in pressure by inducing the target deformation/deflection in SMA washer 180(i) through adaptive feedback control (e.g., adjusting the input power feed) based on the monitored temperature associated with the BGA device. SMA controller 185 may adjust the power feed to maintain a desired temperature of heater 210(i), and thereby maintain the appropriate spring compression for a target contact pressure. Thus, based on the neutral and active states, SMA washer 180(i) may control compression of spring 230(i) to manage contact pressure of heat sink 160 on the BGA device.

It will be appreciated that any suitable dimensions and materials may be used in accordance with the techniques described herein. The relative contribution of spring force and incremental increase by SMA deflection may be defined for specific designs. Furthermore, the deformation and load contribution may be optimized for specific applications, and spring and washer designs may be selected accordingly.

In one example, anti-rotation features may be implemented to avoid rotation on screw 250(i). The anti-rotation features may help stabilize the orientation of SMA washer 180(i), washer 220(i), and/or screw 250(i) to prevent potential damage to heater 210(i) and/or wires 195(i). The anti-rotation feature may include a slit or guide in one component (e.g., SMA washer 180(i) and/or washer 220(i)) and a matching protrusion in another component (e.g., screw 250(i)) to prevent SMA washer 180(i), washer 220(i), and/or screw 250(i) from rotating relative to each other.

When SMA washer 180(i) is in the neutral state, the spring force may be sufficient to stabilize heat sink 160 on the BGA device without creating excessive loading on one or more balls of BGA 130 during transportation/handling/shipping of system 100. To ensure that SMA washer 180(i) remains in the neutral state during shipping, an SMA material may be selected for SMA washer 180(i) that does not activate at transportation/storage temperatures. When system 100 is operating, the power feed may be optimized to increase contact pressure and thereby keep the temperature of the BGA device below its reliability limits. Maintaining the temperature of the BGA device may also automatically limit the temperature of PCB 120. It will be appreciated that SMA controller 185 may dynamically and incrementally adjust the contact pressure during operation of system 100 to ensure that heat sink 160 is drawing an appropriate amount of heat from die 140 without applying undue pressure to the balls of BGA 130.

It will be appreciated that any suitable arrangement may be employed in accordance with the techniques described herein. In one example, an SMA washer may be positioned/installed at any suitable point within a pressure control assembly (e.g., within a backing plate). In another example, a pressure control assembly may operate to control the pressure of a heat sink on a BGA device without an SMA controller. The pressure control assembly may still control the pressure based on a temperature associated with the BGA device, but in this case, the temperature associated with the BGA device may be correlated with an ambient temperature. When the ambient temperature crosses a threshold, an SMA washer in the pressure control assembly may activate, thereby increasing the pressure. The SMA washer may be designed to have any suitable activation temperature, which may depend on the specific application of the pressure control assembly, among other factors.

Figure 3A:
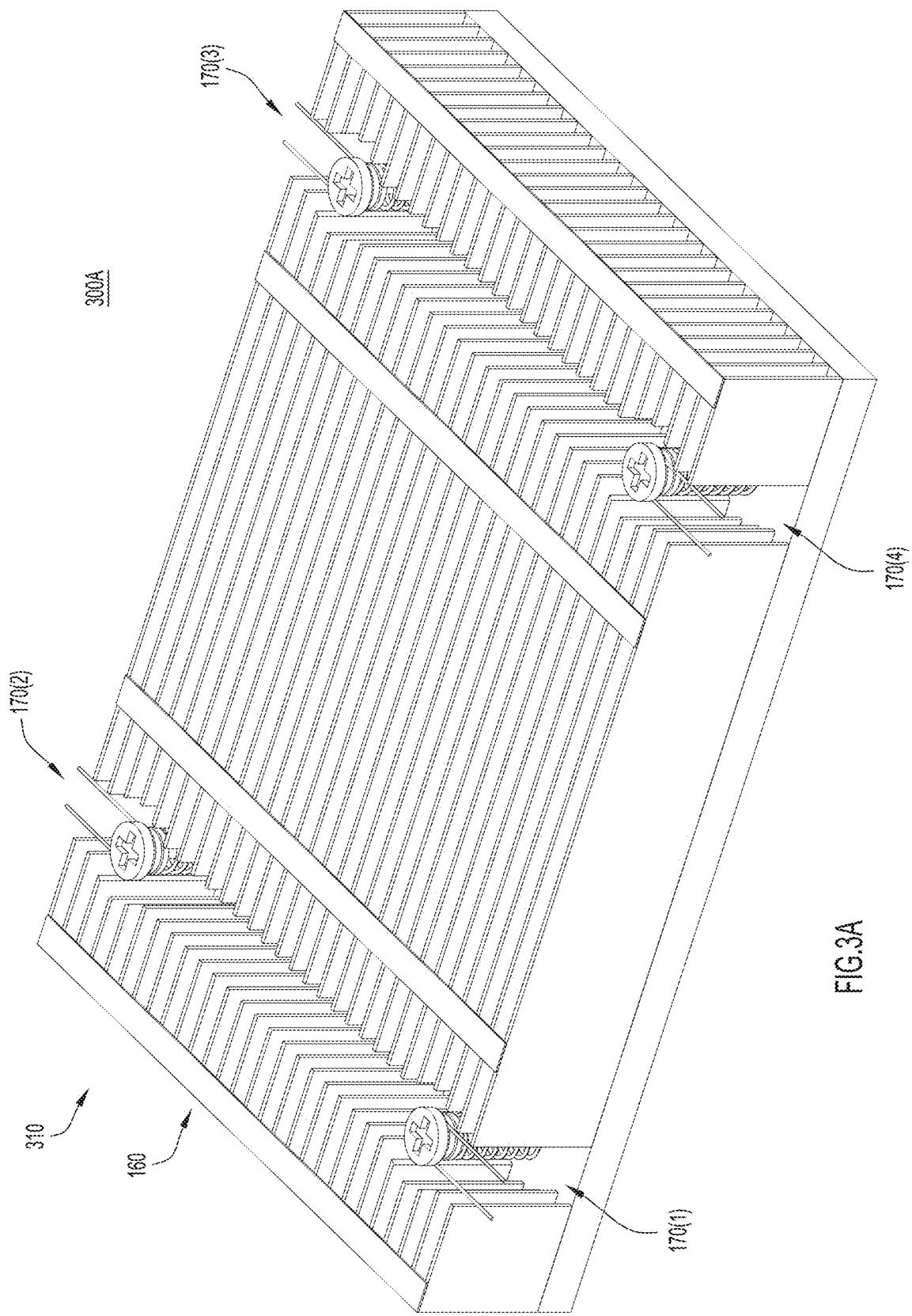
FIG. 3A-3C illustrate respective views of the system of FIG. 1, according to an example embodiment.

With continuing reference to FIGS. 1, 2A, and 2B, FIGS. 3A-3C illustrate views 300A-300C of apparatus 310, according to an example embodiment. With reference to FIG. 3A, perspective view 300A shows system 100 including pressure control assemblies 170(1)-170(4) integrated with heat sink 160. Heat sink 160 is a four-hole heat sink configured for a large BGA (e.g., BGA 130), with one hole placed in each corner of heat sink 160. Pressure control assemblies 170(1)-170(4) are inserted into the holes to uniformly distributed contact pressure and avoid over-loading the corner balls. Factors such as the number of mounting holes, screws, and pressure control assemblies may be customized for specific use cases to regulate contact pressure uniformity. These factors may depend on, for example, the sizes/dimensions of the BGA and/or heat sink.

Figure 3B:
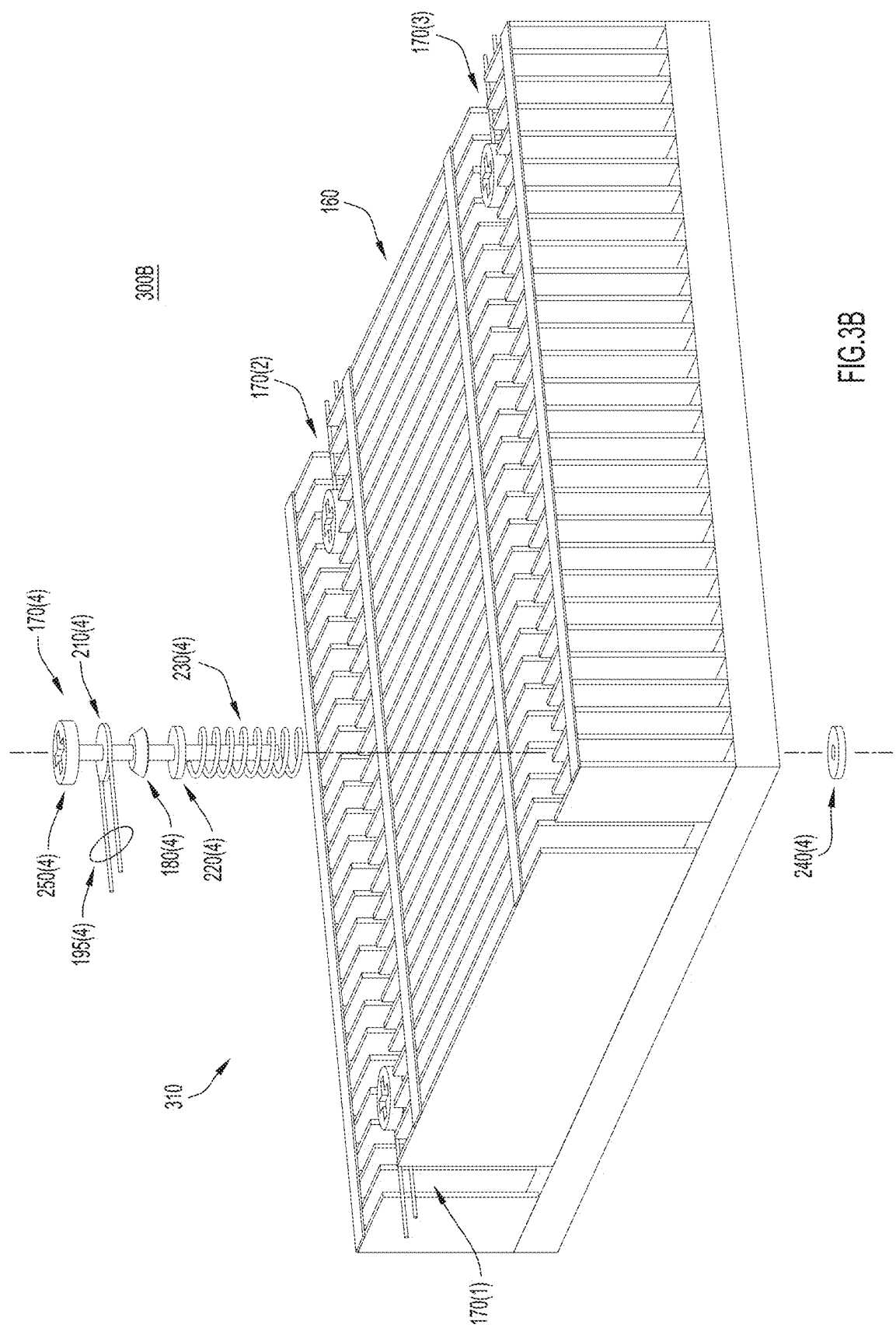

With reference to FIG. 3B, perspective view 300B shows apparatus 310 with an exploded view of pressure control assembly 170(4). As discussed in connection with FIGS. 2A and 2B, pressure control assembly 170(4) includes wires 195(4), heater 210(4), SMA washer 180(4), washer 220(4), spring 230(4), clip 240(4), and screw 250(4). Pressure control assemblies 170(1)-170(3) may include similar components: wires 195(1)-195(3), heaters 210(1)-210(3), SMA washers 180(1)-180(3), washers 220(1)-220(3), springs 230(1)-230(3), clips 240(1)-240(3), and screws 250(1)-250(3).

Apparatus 310 includes screws 250(1)-250(4), which are configured to attach heat sink 160 to PCB 120. Apparatus 310 further includes SMA washers 180(1)-180(4) disposed on screws 250(1)-250(4), respectively. Each SMA washer of SMA washers 180(1)-180(4) is configured to apply a first (e.g., low) amount of a pressure of heat sink 160 on the BGA device when the SMA washer is in a first (e.g., neutral) state, and a second (e.g., high) amount of pressure when the SMA washer is in a second (e.g., activated) state. Apparatus 310 further includes springs 230(1)-230(4) disposed on screws 250(1)-250(4), respectively. Each of the springs 230(1)-230(4) is configured to provide a restoring force to a corresponding SMA washer of SMA washers 180(1)-180(4) to bias the corresponding SMA washer to the first (e.g., neutral) state.

Figure 3C:
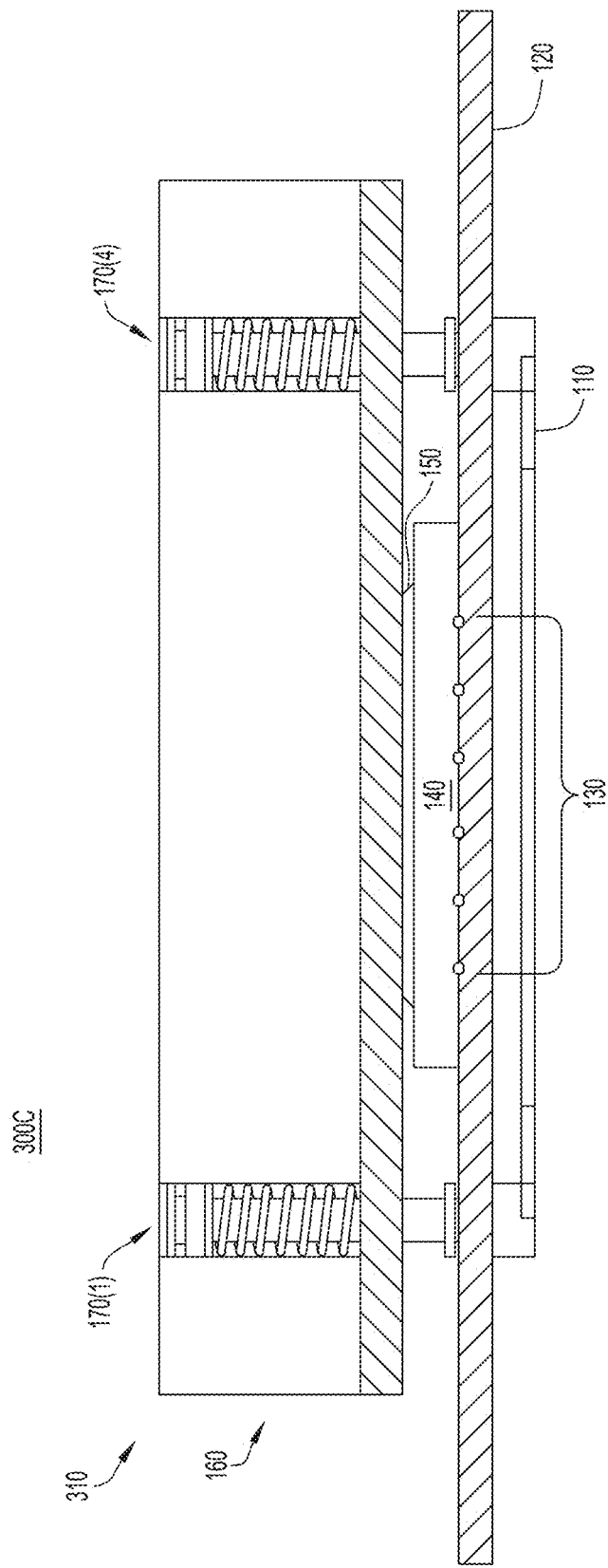

With reference to FIG. 3C, cross-sectional view 300C shows a side view of apparatus 310. As shown, pressure control assembly 170(1) and pressure control assembly 170(4) are housed in heat sink 160. FIG. 3C also illustrates plate 110, PCB 120, BGA 130, die 140, and TIM 150 connected to heat sink 160 via pressure control assemblies 170(1)-170(4).

With continuing reference to FIGS. 1, 2A, and 2B, FIGS. 4A and 4B illustrate a pressure control assembly 400(i) in a neutral state and an activated state, respectively, according to an example embodiment. Pressure control assembly 400(i) is similar to pressure control assembly 170(i) except that pressure control assembly 400(i) includes metal discs 410(i) and 420(i) instead of heater 210(i) and washer 220(i). Furthermore, the positive lead of wires 195(i) connects to metal disc 410(i) and the negative lead of wires 195(i) connects to metal disc 420(i).

Figure 4A:
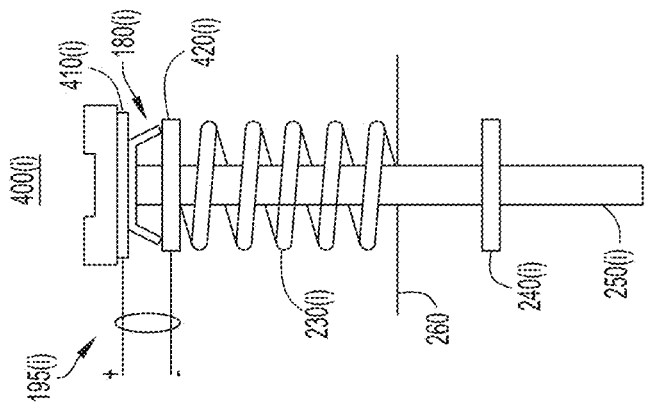
FIGS. 4A and 4B illustrate a pressure control assembly that includes a Shape Memory Alloy (SMA) washer configured as a resistive element, according to an example embodiment.
Figure 4B:
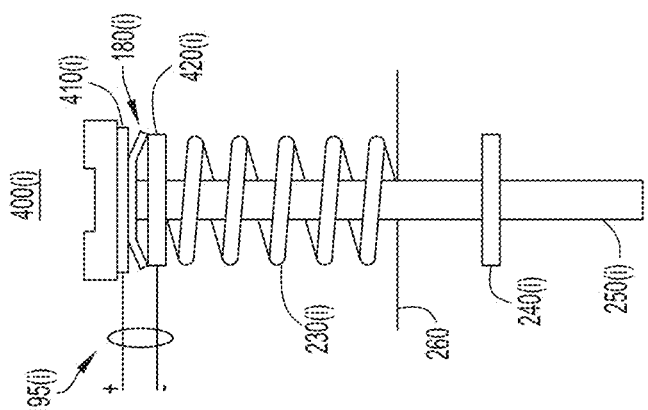

In this arrangement, SMA washer 180(i) is configured as a resistive element that, when heated, transitions from a first, neutral state (FIG. 4A) to a second, activated state (FIG. 4B). In this example, metal discs 410(i) and 420(i) (instead of heater 210(i)) are used to heat/activate SMA washer 180(i) and thereby control deformation. To avoid undesired electrical contacts, screw 250(i) and other metal parts (e.g., spring 230(i)) may be electrically insulated (e.g., treated with a non-conductive over-mold), or may be constructed from an electrically non-conductive material.

The examples described above involve one SMA washer per pressure control assembly; however, in other embodiments, one pressure control assembly may include any suitable number of SMA washers in any suitable configuration. FIG. 5A illustrates configuration 500A involving a single SMA washer 510(1), as described in connection with FIGS. 1, 2A, 2B, 3A-3C, 4A, and 4B. FIGS. 5B-5D illustrate configurations 500B-500D involving SMA washers 510(2)-510(16) arranged in parallel and/or in series.

In configuration 500B (FIG. 5B), SMA washers 510(2)-510(4) are arranged in parallel (nested). When activated, SMA washers 510(2)-510(4) in configuration 500B may increase the load compared to SMA washer 510(1) in configuration 500A. In configuration 500C (FIG. 5C), SMA washers 510(5)-510(8) are arranged in series (positioned in alternating orientations). When activated, SMA washers 510(5)-510(8) in configuration 500C may increase the deflection compared to SMA washer 510(1) in configuration 500A.

In configuration 500D (FIG. 5D), SMA washers 510(9)-510(16) are arranged in parallel and series. That is, SMA washers 510(9) and 510(10) are arranged in parallel, SMA washers 510(10) and 510(11) are arranged in series, etc. It will be appreciated that any suitable number and arrangement of SMA washers (e.g., series, parallel, or a combination of series and parallel) may be integrated into a pressure control assembly in accordance with the techniques described herein.

Additional embodiments are provided for ensuring uniform distribution of contact pressure on a BGA device by dynamically controlling heat sink loading. In one example, in addition to a spring, a heat sink design may also include one or more SMA wires configured to clamp/secure the heat sink. When heated, the SMA wires may provide additional pressure on the heat sink over the BGA to provide sufficient contact pressure for optimum cooling performance, while ensuring that compressive forces do not damage the BGA balls. The SMA wires may be used in addition or alternative to the SMA washers described herein to leverage heat sink temperature and incrementally increase contact pressure.

The SMA wires may be clamped to a structural plate on which the heat sink is assembled. The structural plate, which may be configured to prevent flexing of the PCB assembly, may be assembled on the top or bottom side of the PCB. SMA wires may pass through a protrusion on the heat sink. The protrusion height and pitch may be optimized depending on the desired contact pressure.

In operation, the SMA wires, which are in contact with heat sink, heat up to temperatures beyond their activation temperature. Upon activation, the heated SMA wires shrink, applying additional pressure of the heat sink on BOA to improve contact resistance. Power circuitry may activate the SMA wires based on the BGA die temperature. A thermally conductive, electrically insulated interface material may be used to provide electrical insulation. The power circuit may activate the SMA wires when contact pressure alone is insufficient to cool the BOA. The power circuit may provide additional resistive heating to the SMA wires to shrink them and apply more pressure.

An SMA controller may use adaptive feedback based on BOA die temperature to control a current through the SMA wires. The SMA controller may continuously monitor the BGA die temperature and accordingly control the power feed and the corresponding SMA wire contraction. Thus, the SMA controller may control the SMA clamping force by adjusting the power feed to manage the target SMA deformation using adaptive feedback control based on real-time BGA die temperature to maintain its temperature within permissible limits.

The SMA wires may remain in a neutral state while the BGA die temperature remains within reliability limits. When the BGA die temperature exceeds those limits, the SMA controller may activate the SMA wire and control the contact pressure to ensure that the BGA die temperature remains within its limits. The SMA controller may monitor BGA temperature using adaptive feedback and adjust the power feed accordingly. Once an SMA wire is in an activated state, it may remain in that state until a restoring force (e.g., spring force) is applied.

In some situations, the power feed may be stopped and the SMA wire may return to its neutral state due to operating shocks/vibrations. The neutral SMA wire may lower contact pressure and cause BGA temperature to rise. If the BGA temperature rises beyond a threshold, the adaptive feedback may prompt the SMA controller to restart the power feed and cause the SMA wire to transition back to the activated state.

There are several different SMA profiles that may be used to clamp the heat sink based on the heat sink design. In any case, the SMA property of contraction under high temperatures may be used to control heat sink loading on the BGA device. In this manner, temperature may be adjusted to optimum values for cooling and to avoid excessive loading of BGA balls. Springs may be designed for minimum contact pressure to avoid excessive loading on the BGA, and the additional contact pressure may be applied using SMA wires when system is operational.

In one example, a PWM based feed may be used to lower power consumption. In addition, material creep may have an impact on the uniformity of the clamping force over time, but since the behavior of SMA is controlled by adaptive feedback, the feed may be adjusted to maintain the clamping force over time to maintain the BGA temperature within the maximum limits.

These techniques may prevent BGA damage due to excessive mechanical shock during transportation and handling while offsetting the loading of spring forces and associated heat sink contact issues, including contact issues in inverted (upside-down) installation of spring-loaded heat sinks. This solution may have minimal impact on PCB real-estate, avoiding additional mounting holes, major changes on placement keep-out regions, etc.

Figure 6:
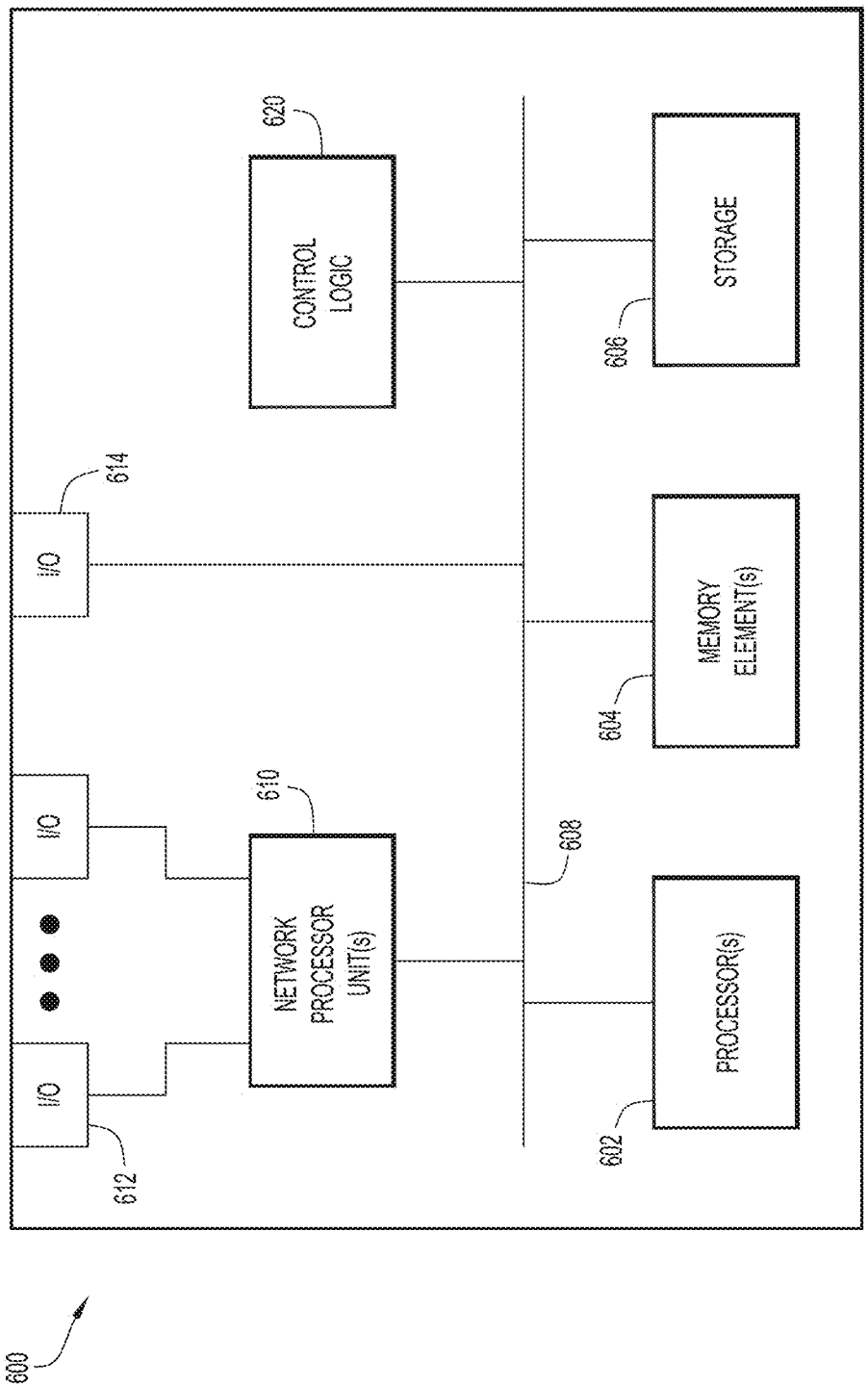
FIG. 6 illustrates a hardware block diagram of a computing device configured to perform functions associated with operations discussed herein, according to an example embodiment.

Referring to FIG. 6, FIG. 6 illustrates a hardware block diagram of a computing device 600 (e.g., SMA controller 185) that may perform functions associated with operations discussed herein in connection with the techniques depicted in one or more of the preceding figures. In various embodiments, a computing device, such as computing device 600 or any combination of computing devices 600, may be configured as any entity/entities as discussed for the techniques depicted in connection with one or more of the preceding figures in order to perform operations of the various techniques discussed herein.

In at least one embodiment, computing device 600 may include one or more processor(s) 602, one or more memory element(s) 604, storage 606, a bus 608, one or more network processor unit(s) 610 interconnected with one or more network input/output (I/O) interface(s) 612, one or more I/O interface(s) 614, and control logic 620. In various embodiments, instructions associated with logic for computing device 600 can overlap in any manner and are not limited to the specific allocation of instructions and/or operations described herein.

In at least one embodiment, processor(s) 602 is/are at least one hardware processor configured to execute various tasks, operations and/or functions for computing device 600 as described herein according to software and/or instructions configured for computing device 600. Processor(s) 602 (e.g., a hardware processor) can execute any type of instructions associated with data to achieve the operations detailed herein. In one example, processor(s) 602 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 604 and/or storage 606 is/are configured to store data, information, software, and/or instructions associated with computing device 600, and/or logic configured for memory element(s) 604 and/or storage 606. For example, any logic described herein (e.g., control logic 620) can, in various embodiments, be stored for computing device 600 using any combination of memory element(s) 604 and/or storage 606. Note that in some embodiments, storage 606 can be consolidated with memory elements 604 (or vice versa), or can overlap/exist in any other suitable manner.

In at least one embodiment, bus 608 can be configured as an interface that enables one or more elements of computing device 600 to communicate in order to exchange information and/or data. Bus 608 can be implemented with any architecture designed for passing control, data and/or information between processors, memory elements/storage, peripheral devices, and/or any other hardware and/or software components that may be configured for computing device 600. In at least one embodiment, bus 608 may be implemented as a fast kernel-hosted interconnect, potentially using shared memory between processes (e.g., logic), which can enable efficient communication paths between the processes.

In various embodiments, network processor unit(s) 610 may enable communication between computing device 600 and other systems, entities, etc., via network I/O interface(s) 612 to facilitate operations discussed for various embodiments described herein. In various embodiments, network processor unit(s) 610 can be configured as a combination of hardware and/or software, such as one or more Ethernet driver(s) and/or controller(s) or interface cards, Fibre Channel (e.g., optical) driver(s) and/or controller(s), and/or other similar network interface driver(s) and/or controller(s) now known or hereafter developed to enable communications between computing device 600 and other systems, entities, etc. to facilitate operations for various embodiments described herein. In various embodiments, network I/O interface(s) 612 can be configured as one or more Ethernet port(s), Fibre Channel ports, and/or any other I/O port(s) now known or hereafter developed. Thus, the network processor unit(s) 610 and/or network I/O interfaces 612 may include suitable interfaces for receiving, transmitting, and/or otherwise communicating data and/or information in a network environment.

I/O interface(s) 614 allow for input and output of data and/or information with other entities that may be connected to computing device 600. For example, I/O interface(s) 614 may provide a connection to external devices such as a keyboard, keypad, a touch screen, and/or any other suitable input device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 620 can include instructions that, when executed, cause processor(s) 602 to perform operations, which can include, but not be limited to, providing overall control operations of computing device 600; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 620) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, Random Access Memory (RAM), Read Only Memory (ROM), Erasable Programmable ROM (EPROM), Application Specific Integrated Circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, Digital Signal Processing (DSP) instructions, software [potentially inclusive of object code and source code], etc.) for execution by one or more processor(s), and/or other similar machine, etc. Generally, memory element(s) 604 and/or storage 606 can store data, software, code, instructions (e.g., processor instructions), logic, parameters, combinations thereof, and/or the like used for operations described herein. This includes memory elements 604 and/or storage 606 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, Compact Disc ROM (CD-ROM), Digital Versatile Disc (DVD), memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to computing device 600 for transfer onto another computer readable storage medium.

FIG. 7 is a flowchart of an example method 700 for performing functions associated with operations discussed herein. Method 700 may be performed by any suitable entity, such as SMA controller 185. At operation 710, a first amount of a pressure of a heat sink is applied on a ball grid array device based on a first temperature range associated with the ball grid array device via a SMA washer in a first state. At operation 720, a second amount of the pressure of the heat sink is applied on the ball grid array device based on a second temperature range associated with the ball grid array device via the SMA washer in a second state.

The pressure control assemblies described herein may prevent BGA failures during transportation and handling. These pressure control assemblies may dynamically control contact pressure, preventing BGA damage due to excessing pressure while maintaining BGA temperature within its maximum allowable limits. Maintaining the target contact pressure improves thermal performance, allows fans to run at lower speeds, reduces power consumption and acoustic noise, and improves reliability.

Power consumption may be reduced by activating the power feed in response to the BGA die temperature exceeding a thermal limit. High contact pressure may be activated for abnormal operating conditions (such as Network Equipment Building System (NEBS) short term), while in other cases the spring force alone might meet thermal performance and as a result SMA activation via the power feed may not be required. Power consumption may be further reduced by provisioning a Pulse-Width Modulation (PWM) feed, instead of a continuous power feed.

While specific examples are provided which relate to heat sinks and BGA devices, it will be appreciated that the techniques described herein may control contact pressure at the interface of any heat generating surface (e.g., a BGA device) and a heat dissipating surface (e.g., heat sink). In general, these surfaces may be tightly held (e.g., clamped) together, but over time the mechanism (e.g., clamps) holding these surfaces together can weaken due to creep or shock/vibration exposure, which can reduce the contact pressure between the surfaces. Using the pressure control assemblies described herein (e.g., including an SMA washer, adaptive feedback control, etc.) these techniques may ensure that an optimum contact pressure is maintained between these surfaces. As a result, the application of SMA washers to control contact pressure may be used in any suitable application involving a heat generating surface in contact with a heat dissipating surface to improve heat transfer.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In one form, an apparatus is provided. The apparatus comprises: a ball grid array device; a heat sink thermally coupled to the ball grid array device; and a pressure control assembly configured to dynamically control a pressure of the heat sink on the ball grid array device based on a temperature associated with the ball grid array device, wherein the pressure control assembly includes a shape memory alloy washer configured to apply a first amount of the pressure when the shape memory alloy washer is in a first state, and a second amount of the pressure when the shape memory alloy washer is in a second state.

In one example, the apparatus further comprises: a shape memory alloy controller coupled to a temperature sensor configured to obtain an indication of the temperature associated with the ball grid array device, wherein the shape memory alloy controller is configured to: obtain the indication of the temperature associated with the ball grid array device; and based on the indication of the temperature associated with the ball grid array device, cause the shape memory alloy washer to transition between the first state and the second state.

In one example, the apparatus further comprises a heater thermally coupled to the shape memory alloy washer, wherein the heater is configured to cause the shape memory alloy washer to transition from the first state to the second state.

In one example, the shape memory alloy washer is configured as a resistive element that, when heated, transitions from the first state to the second state.

In one example, the apparatus further comprises a spring configured to provide a restoring force to the shape memory alloy washer to bias the shape memory alloy washer to the first state In one example, the apparatus further comprises a plurality of shape memory alloy washers, including the shape memory alloy washer, arranged in series and/or in parallel.

In one example, the first state is a neutral state of the shape memory alloy washer, and the second state is an activated state of the shape memory alloy washer.

In one example, the apparatus further comprises a printed circuit board on which the ball grid array device is mounted.

In one example, a method is provided, the method comprising transporting the apparatus while the shape memory alloy washer is in the first state, wherein the first amount of the pressure is less than the second amount of the pressure.

In one example, the apparatus further comprises one or more shape memory alloy wires configured to dynamically control the pressure of the heat sink on the ball grid array device.

In another form, another method is provided. The other method comprises: based on a first temperature range associated with a ball grid array device, applying, via a shape memory alloy washer in a first state, a first amount of a pressure of a heat sink on the ball grid array device; and based on a second temperature range associated with the printed circuit board, applying, via the shape memory alloy washer in a second state, a second amount of the pressure of the heat sink on the ball grid array device.

In one example, the other method further comprises: obtaining, from a temperature sensor, an indication of a temperature associated with the ball grid array device; and based on the indication of the temperature associated with the ball grid array device, causing the shape memory alloy washer to transition between the first state and the second state.

In one example, the other method further comprises: causing the shape memory alloy washer to transition from the first state to the second state by activating a heater thermally coupled to the shape memory alloy washer.

In one example, the other method further comprises: causing the shape memory alloy washer to transition from the first state to the second state by heating the shape memory alloy washer, wherein the shape memory alloy washer is configured as a resistive element.

In one example, the other method further comprises: causing the shape memory alloy washer to transition from the second state to the first state by applying a restoring force via a spring to the shape memory alloy washer.

In one example, applying the first amount of the pressure and the second amount of the pressure via the shape memory alloy washer includes: applying the first amount of the pressure and the second amount of the pressure via a plurality of shape memory alloy washers, including the shape memory alloy washer, arranged in series and/or in parallel.

In another form, another apparatus is provided. The other apparatus comprises: a plurality of screws configured to attach a heat sink to a ball grid array device; a shape memory alloy washer disposed on each screw, each shape memory alloy washer configured to apply a first amount of a pressure of the heat sink on the ball grid array device when the shape memory alloy washer is in a first state, and a second amount of the pressure when the shape memory alloy washer is in a second state; and a spring disposed on each screw, each spring configured to provide a restoring force to a corresponding shape memory alloy washer to bias the corresponding shape memory alloy washer to the first state.

In one example, the other apparatus further comprises: a shape memory alloy controller coupled to a temperature sensor configured to obtain an indication of a temperature associated with the ball grid array device, wherein the shape memory alloy controller is configured to: obtain the indication of the temperature associated with the ball grid array device; and based on the indication of the temperature associated with the ball grid array device, cause one or more of the shape memory alloy washers to transition between the first state and the second state.

In one example, the other apparatus further comprises: a heater thermally coupled to the shape memory alloy washer, wherein the heater is configured to cause the shape memory alloy washer to transition from the first state to the second state.

In one example, the shape memory alloy washer is configured as a resistive element that, when heated, transitions from the first state to the second state.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:
    a ball grid array device;
    a heat sink thermally coupled to the ball grid array device; and
    a pressure control assembly configured to dynamically control a pressure of the heat sink on the ball grid array device based on a temperature associated with the ball grid array device,
    wherein the pressure control assembly includes a shape memory alloy washer configured to apply a first amount of the pressure when the shape memory alloy washer is in a first state, and a second amount of the pressure when the shape memory alloy washer is in a second state.

2. The apparatus of claim 1, further comprising:
    a shape memory alloy controller coupled to a temperature sensor configured to obtain an indication of the temperature associated with the ball grid array device, wherein the shape memory alloy controller is configured to:
        obtain the indication of the temperature associated with the ball grid array device; and
        based on the indication of the temperature associated with the ball grid array device, cause the shape memory alloy washer to transition between the first state and the second state.

3. The apparatus of claim 1, further comprising a heater thermally coupled to the shape memory alloy washer, wherein the heater is configured to cause the shape memory alloy washer to transition from the first state to the second state.

4. The apparatus of claim 1, wherein the shape memory alloy washer is configured as a resistive element that, when heated, transitions from the first state to the second state.

5. The apparatus of claim 1, further comprising a spring configured to provide a restoring force to the shape memory alloy washer to bias the shape memory alloy washer to the first state.

6. The apparatus of claim 1, further comprising a plurality of shape memory alloy washers, including the shape memory alloy washer, arranged in series and/or in parallel.

7. The apparatus of claim 1, wherein the first state is a neutral state of the shape memory alloy washer, and the second state is an activated state of the shape memory alloy washer.

8. The apparatus of claim 1, further comprising:
    a printed circuit board on which the ball grid array device is mounted.

9. A method comprising transporting the apparatus of claim 1 while the shape memory alloy washer is in the first state, wherein the first amount of the pressure is less than the second amount of the pressure.

10. The apparatus of claim 1, further comprising:
    one or more shape memory alloy wires configured to dynamically control the pressure of the heat sink on the ball grid array device.

11. A method comprising:
    based on a first temperature range associated with a ball grid array device, applying, via a shape memory alloy washer in a first state, a first amount of a pressure of a heat sink on the ball grid array device; and
    based on a second temperature range associated with the ball grid array device, applying, via the shape memory alloy washer in a second state, a second amount of the pressure of the heat sink on the ball grid array device.

12. The method of claim 11, further comprising:
    obtaining, from a temperature sensor, an indication of a temperature associated with the ball grid array device; and
    based on the indication of the temperature associated with the ball grid array device, causing the shape memory alloy washer to transition between the first state and the second state.

13. The method of claim 11, further comprising:
    causing the shape memory alloy washer to transition from the first state to the second state by activating a heater thermally coupled to the shape memory alloy washer.

14. The method of claim 11, further comprising:
    causing the shape memory alloy washer to transition from the first state to the second state by heating the shape memory alloy washer, wherein the shape memory alloy washer is configured as a resistive element.

15. The method of claim 11, further comprising:
    causing the shape memory alloy washer to transition from the second state to the first state by applying a restoring force via a spring to the shape memory alloy washer.

16. The method of claim 11, wherein applying the first amount of the pressure and the second amount of the pressure via the shape memory alloy washer includes:
    applying the first amount of the pressure and the second amount of the pressure via a plurality of shape memory alloy washers, including the shape memory alloy washer, arranged in series and/or in parallel.

17. An apparatus comprising:
    a plurality of screws configured to attach a heat sink to a ball grid array device;
    a shape memory alloy washer disposed on each screw, each shape memory alloy washer configured to apply a first amount of a pressure of the heat sink on the ball grid array device when the shape memory alloy washer is in a first state, and a second amount of the pressure when the shape memory alloy washer is in a second state; and
    a spring disposed on each screw, each spring configured to provide a restoring force to a corresponding shape memory alloy washer to bias the corresponding shape memory alloy washer to the first state.

18. The apparatus of claim 17, further comprising:
a shape memory alloy controller coupled to a temperature sensor configured to obtain an indication of a temperature associated with the ball grid array device, wherein the shape memory alloy controller is configured to:
   obtain the indication of the temperature associated with the ball grid array device; and
   based on the indication of the temperature associated with the ball grid array device, cause at least one shape memory alloy washer to transition between the first state and the second state.

19. The apparatus of claim 17, further comprising:
a heater thermally coupled to the shape memory alloy washer, wherein the heater is configured to cause the shape memory alloy washer to transition from the first state to the second state.

20. The apparatus of claim 17, wherein the shape memory alloy washer is configured as a resistive element that, when heated, transitions from the first state to the second state.

\* \* \* \* \*